(12) United States Patent
Citla et al.

(10) Patent No.: US 11,631,591 B2
(45) Date of Patent: *Apr. 18, 2023

(54) METHODS FOR DEPOSITING DIELECTRIC MATERIAL

(71) Applicant: Applied Materials, Inc., Santa Clara, CA (US)

(72) Inventors: Bhargav S. Citla, Fremont, CA (US); Jethro Tannos, San Jose, CA (US); Jingyi Li, San Jose, CA (US); Douglas A. Buchberger, Jr., Livermore, CA (US); Zhong Qiang Hua, Saratoga, CA (US); Srinivas D. Nemani, Sunnyvale, CA (US); Ellie Y. Yieh, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 17/408,943

(22) Filed: Aug. 23, 2021

(65) Prior Publication Data

US 2021/0384040 A1 Dec. 9, 2021

Related U.S. Application Data

(62) Division of application No. 16/132,837, filed on Sep. 17, 2018, now Pat. No. 11,114,306.

(51) Int. Cl.
*C23C 16/505* (2006.01)
*H01L 21/311* (2006.01)
(Continued)

(52) U.S. Cl.
CPC ...... *H01L 21/31138* (2013.01); *C23C 16/505* (2013.01); *C23C 16/509* (2013.01);
(Continued)

(58) Field of Classification Search
CPC ... C23C 16/505; C23C 16/509; C23C 16/515; C23C 16/517
See application file for complete search history.

(56) References Cited

U.S. PATENT DOCUMENTS 6,413,583 B1 7/2002 Moghadam et al.
9,484,202 B1 * 11/2016 Zhou ............... H01L 21/311
(Continued)

FOREIGN PATENT DOCUMENTS

CN 103828057 B * 11/2016 ............ H01L 29/78
KR 10-0529298 * 11/2005 ............ H01L 21/20
(Continued)

OTHER PUBLICATIONS

Kim, Hyungchul, et al., "Effect of DC Bias on the Plasma Properties in Remote Plasma Atomic Layer Deposition and Its Application to HfO2 Thin Films". Journal of The Electrochemical Society, 158 (1) H21-H24, 2011.*

(Continued)

*Primary Examiner* — Bret P Chen
(74) *Attorney, Agent, or Firm* — Moser Taboada

(57) ABSTRACT

Methods for depositing a dielectric material using RF bias pulses along with remote plasma source deposition for manufacturing semiconductor devices, particularly for filling openings with high aspect ratios in semiconductor applications are provided. For example, a method of depositing a dielectric material includes providing a gas mixture into a processing chamber having a substrate disposed therein, forming a remote plasma in a remote plasma source and delivering the remote plasma to an interior processing region defined in the processing chamber, applying a RF bias power to the processing chamber in pulsed mode, and forming a dielectric material in an opening defined in a (Continued)

material layer disposed on the substrate in the presence of the gas mixture and the remote plasma.

20 Claims, 5 Drawing Sheets

(51) Int. Cl.
H01L 21/762 (2006.01)
H01J 37/32 (2006.01)
H01L 21/3065 (2006.01)
H01L 21/67 (2006.01)
C23C 16/515 (2006.01)
H01L 21/02 (2006.01)
C23C 16/509 (2006.01)
C23C 16/517 (2006.01)

(52) U.S. Cl.
CPC .......... *C23C 16/515* (2013.01); *C23C 16/517* (2013.01); *H01J 37/32422* (2013.01); *H01L 21/02274* (2013.01); *H01L 21/3065* (2013.01); *H01L 21/67207* (2013.01); *H01L 21/76224* (2013.01); *H01J 2237/3321* (2013.01); *H01J 2237/3327* (2013.01)

(56) References Cited

U.S. PATENT DOCUMENTS

| 11,114,306 B2* | 9/2021 | Citla | H01L 21/67167 |
| 2004/0256351 A1* | 12/2004 | Chung | H01L 21/28556 257/E21.252 |
| 2011/0189860 A1* | 8/2011 | Porshnev | H01L 21/32105 438/785 |
| 2015/0262869 A1* | 9/2015 | Naik | H01L 21/32139 438/643 |
| 2017/0092467 A1* | 3/2017 | Dhindsa | H01L 21/67069 |
| 2017/0092492 A1* | 3/2017 | Zhao | H01L 21/0217 |
| 2017/0372899 A1* | 12/2017 | Yang | H01L 21/02274 |
| 2019/0301009 A1 | 10/2019 | Kaufman-Osborn et al. | |

FOREIGN PATENT DOCUMENTS

| WO | WO 2013/048516 A1 * | 4/2013 | H01L 29/78 |
| WO | WO 2016/149541 A1 | 9/2016 | |

OTHER PUBLICATIONS

Martin, I T, et al., "The effect of low frequency pulse-shaped substrate bias on the remote plasma deposition of a-Si : H thin films". 2010 Plasma Sources Science and Technology, 19 015012, pp. 1-10.*

Profijt, H. B., et al., "Substrate-biasing during plasma-assisted atomic layer deposition to tailor metal-oxide thin film growth". Journal of Vacuum Science and Technology A: Vacuum, Surfaces, and Films, vol. 31 No.1, Jan./Feb. 2013, 01A106, pp. 1-10.*

Milella, Antonella, et al., "Remote Plasma Deposited Silicon Dioxide-Like Film Densification by Means of RF Substrate Biasing: Film Chemistry and Morphology". Plasma Processes and Polymers 2007, 4, 621-628.*

Profijt, H.B., et al., "Substrate-biasing during plasma-assisted atomic layer deposition to tailor metal-oxide thin film growth". J. Vac. Sci. Technol. A 31(1), Jan./Feb. 2013, 01A106-1 to 01A106-9.*

Vanhulsel, A., et al., "Inductively coupled r.f. plasma assisted chemical vapour deposition of diamond-like carbon coatings". Diamond and Related Materials 8 (1999) 1193-1197.*

Kim, Hyungchul, et al., "DC Biased Remote Plasma Atomic Layer Deposition and its Applications". ECS Transactions, 33 (2) 395-401 (2010).*

* cited by examiner

METHODS FOR DEPOSITING DIELECTRIC MATERIAL

CROSS-REFERENCE TO RELATED APPLICATIONS

The present application is a divisional application of U.S. patent application Ser. No. 16/132,837, filed on Sep. 17, 2018, the entire content of which is incorporated herein by reference.

BACKGROUND

Field

Embodiments of the present invention generally relate to methods for depositing a dielectric material using RF bias pulses control during deposition, and more particularly to methods depositing a dielectric material using remote plasma control along with RF bias pulses during deposition in the semiconductor applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. As the width of trenches continues to shrink, the aspect ratio (depth divided by width) continues to grow for the stacking of the semiconductor chips. One challenge regarding the manufacture of high aspect ratio trenches is avoiding the formation of voids during the deposition of dielectric material in the trenches.

To fill a trench, a layer of dielectric material, such as silicon oxide, is deposited. The dielectric layer typically covers the field, as well as the walls and the bottom of the trench. If the trench is wide and shallow, it is relatively easy to completely fill the trench. However, as the trench aspect ratio increases, it becomes more likely that the opening of the trench will "pinch off", forming a void (e.g., defects) within the trench.

To decrease the likelihood of forming a void within the trench or forming seams within the trench, many different process techniques have been developed to fill in the trench with the dielectric materials with minimum defects. Poor process control during the deposition process will result in irregular structure profiles or early closure of the trench, resulting in voids or air gap in the trench while filling the trench with the dielectric materials.

Thus, a need exists for improvements in deposition processes for forming dielectric materials in a trench with desired profiles with minimum defects.

SUMMARY

Embodiments of the present invention provide an apparatus and methods for depositing a dielectric material using RF bias pulses along with remote plasma source deposition for manufacturing semiconductor devices, particularly for filling openings with high aspect ratios in semiconductor applications. In one embodiment, a method of depositing a dielectric material includes providing a gas mixture into a processing chamber having a substrate disposed therein, forming a remote plasma in a remote plasma source and delivering the remote plasma to an interior processing region defined in the processing chamber, applying a RF bias power to the processing chamber in pulsed mode, and forming a dielectric material in an opening defined in a material layer disposed on the substrate in the presence of the gas mixture and the remote plasma.

In another embodiment, a method for forming a dielectric material includes forming a remote plasma from a remote plasma source and delivering the remote plasma to an interior processing region of a processing chamber, applying a RF bias power to a substrate support member disposed in the processing chamber, maintaining a substrate temperature between about −20 degrees Celsius to about 200 degrees Celsius. and forming a dielectric material in an opening defined in a material layer disposed on a substrate.

In yet another embodiment, a method for forming a dielectric material includes filling an opening having an aspect ratio greater 5 on a substrate by a dielectric material formed from a remote plasma and a RF bias power in pulsed mode supplied to an interior processing region of a processing chamber where the substrate is disposed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for depositing a dielectric material in a trench with high aspect ratios for semiconductor devices, particularly for three dimensional (3D) stacking of semiconductor chips. In one embodiment, the deposition process may use remote plasma along with RF bias power in pulsed mode supplied to a substrate support assembly on which the substrate is placed.

The deposition process is performed without in-chamber RF source power generation. The remote plasma generated remotely and the pulsed RF bias power may be supplied to an interior processing region of the processing chamber simultaneously, alternately or sequentially as needed to provide a good gap-filling capability for the dielectric material filling in the trench from the substrate.

Figure 1:
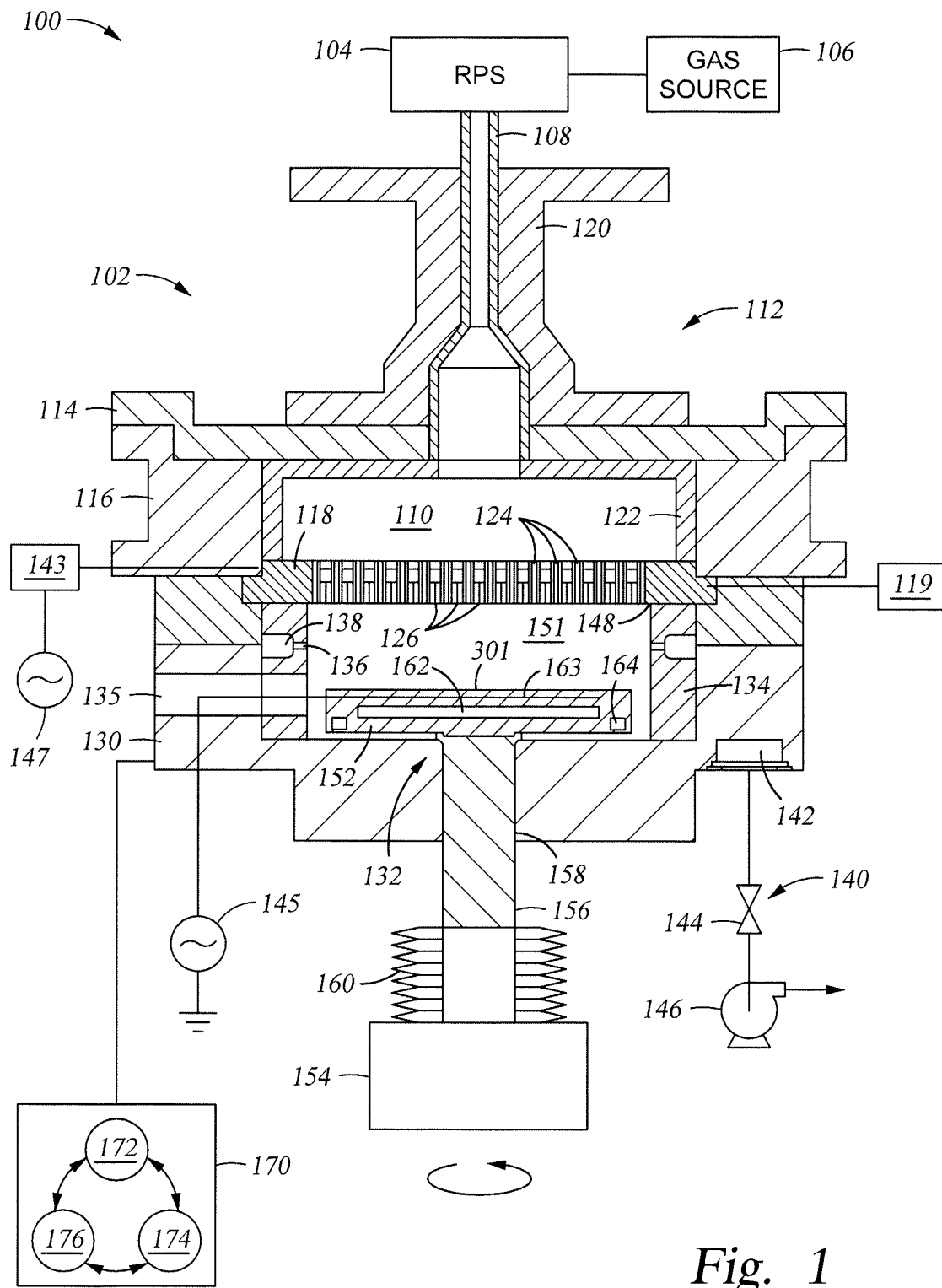
FIG. 1 depicts an apparatus utilized to performing an deposition process in accordance with some embodiment of the present disclosure.

FIG. 1 is a cross-sectional view of a processing chamber 100 for performing a deposition process that can deposit a dielectric material, especially with good gas filling capability, for semiconductor applications. Suitable processing chambers that may be adapted for use with the teachings disclosed herein include, for example, an HDP-PRODUCER or C3 processing chamber available from Applied Materials, Inc. of Santa Clara, Calif. Although the processing chamber 100 is shown including a plurality of features that enable superior mask trimming and structure reshaping process. It is contemplated that other processing chambers may be adapted to benefit from one or more of the inventive features disclosed herein.

The processing chamber 100 includes a processing chamber body 102 and a remote plasma source 104 coupled to the processing chamber body 102. The remote plasma source 104 may be any suitable source that is capable of generating radicals. The remote plasma source 104 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. The remote plasma source 104 may include one or more gas sources 106 and the remote plasma source 104 may be coupled to the processing chamber 100 by a radical conduit 108. One or more process gases, which may be radical-forming gases, may enter the remote plasma source 104 via the one or more gas sources 106. The one or more process gases may comprise an chlorine-containing gas, fluorine containing gas, inert gas, oxygen-containing gas, a nitrogen-containing gas, a hydrogen containing gas, or any combination thereof. Radicals generated in the remote plasma source 104 travel into the processing chamber 100 through the radical conduit 108 coupling to the processing chamber 100, reaching an interior processing region 151 defined in the processing chamber 100.

The radical conduit 108 is a part of a lid assembly 112, which also includes a radical cavity 110, a top plate 114, a lid rim 116, and a showerhead 118. The radical conduit 108 may comprise a material that is substantially nonreactive to radicals. For example, radical conduit 108 may comprise AlN, SiO2, Y2O3, MgO, anodized Al2O3, sapphire, ceramics containing one or more of Al2O3, sapphire, AlN, Y2O3, MgO, or plastics. A representative example of a suitable SiO2 material is quartz. The radical conduit 108 may be disposed within and supported by a radical conduit support member 120. The radical conduit support member 120 may be disposed on the top plate 114, which rests on the lid rim 116.

The radical cavity 110 is positioned below and coupled to the radical conduit 108, and the radicals generated in the remote plasma source 104 travel to the radical cavity 110 through the radical conduit 108. The radical cavity 110 is defined by the top plate 114, the lid rim 116 and the showerhead 118. Optionally, the radical cavity 110 may include a liner 122. The liner 122 may cover surfaces of the top plate 114 and the lid rim 116 that are exposed to the radical cavity 110. Radicals from the remote plasma source 104 pass through a plurality of tubes 124 disposed in the showerhead 118 to enter into an interior processing region 151. The showerhead 118 further includes a plurality of openings 126 that are smaller in diameter than the plurality of tubes 124. The plurality of openings 126 are connected to an internal volume (not shown) that is not in fluid communication with the plurality of tubes 124. One or more fluid sources 119 may be coupled to the showerhead 118 for introducing a fluid mixture into an interior processing region 151 of the processing chamber 100. The fluid mixture may include precursor, porogen, and/or carrier fluids. The fluid mixture may be a mixture of gases and liquids.

The processing chamber 100 may include the lid assembly 112, a chamber body 130 and a substrate support assembly 132. The substrate support assembly 132 may be at least partially disposed within the chamber body 130. The chamber body 130 may include a slit valve 135 to provide access to the interior of the processing chamber 100. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the processing chamber 100.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the interior processing region 151 within the chamber body 130. The interior processing region 151 is defined by a lower surface 148 of the showerhead 118 and an upper surface 150 of the substrate support assembly 132, and the interior processing region 151 is surrounded by the liner 134.

The substrate support assembly 132 may include a substrate support member 152 to support a substrate (not shown) for processing within the chamber body 130. The substrate may be any standard wafer size, such as, for example, 300 mm. Alternatively, the substrate may be larger than 300 mm, such as 450 mm or larger. The substrate support member 152 may comprise aluminum nitride (AlN) or aluminum, depending on operating temperature. The substrate support member 152 may be configured to chuck the substrate to the substrate support member 152. For example, the substrate support member 152 may be an electrostatic chuck or a vacuum chuck.

The substrate support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the substrate support member 152 to be moved vertically within the chamber body 130 between a process position and a lower, transfer position. The transfer position is slightly below the opening of the slit valve 135. During operation, the spacing between the substrate 301 and the showerhead 118 may be minimized in order to maximize radical flux at the substrate surface. For example, the spacing may be between about 100 mm and about 5,000 mm. The lift mechanism 154 may be capable of rotating the shaft 156, which in turn rotates the substrate support member 152, causing the substrate disposed on the substrate support member 152 to be rotated during operation.

One or more heating elements 162 and a cooling channel 164 may be embedded in the substrate support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 164 to cool the substrate. The substrate support member 152 may further include gas passages extending to the upper surface 150 for flowing a cooling gas to the backside of the substrate.

A RF source power 143 may be coupled to the showerhead 118 through a RF source power matching box 147. The RF source power 143 may be low frequency, high frequency, or very high frequency. In one embodiment, the RF source power 143 is a high frequency RF generator that may generate high density plasma for deposit high density film layers. In one example, the RF source power 143 may serve as an inductively coupled RF energy transmitting device that can generate and control the inductive coupled plasma (ICP) generated in the interior processing region 351 above the substrate support member 152. Dynamic impedance matching from the RF source power matching box 147 may be provided when generating the inductive coupled plasma (ICP).

In addition to the RF source power 143, a RF bias power source 145 may be coupled to the substrate support member 152. The substrate support member 152 is configured as a cathode and includes an electrode 163 that is coupled to the RF bias power source 145. The RF bias power source 145 is coupled between the electrode 163 disposed in the substrate support member 152 and another electrode, such as the showerhead 118 or ceiling (top plate 114) of the chamber body 130. The RF bias power generated from the RF bias power source 145 excites and sustains a plasma discharge formed from the gases disposed in the interior processing region 151 of the chamber body 130.

In one mode of operation, the substrate 301 is disposed on the substrate support member 152 in the processing chamber 100. A process gas and/or gas mixture is introduced into the chamber body 130 through the showerhead 118 from the gas sources 106. The vacuum pump 146 maintains the pressure inside the chamber body 130 while removing deposition by-products.

A controller 170 is coupled to the processing chamber 100 to control operation of the processing chamber 100. The controller 170 includes a central processing unit (CPU) 172, a memory 174, and a support circuit 176 utilized to control the process sequence and regulate the gas flows from the gas sources 106. The CPU 172 may be any form of general purpose computer processor that may be used in an industrial setting. The software routines can be stored in the memory 174, such as random access memory, read only memory, floppy, or hard disk drive, or other form of digital storage. The support circuit 176 is conventionally coupled to the CPU 172 and may include cache, dock circuits, input/output systems, power supplies, and the like. Bi-directional communications between the controller 170 and the various components of the processing chamber 100 are handled through numerous signal cables.

Figure 2:
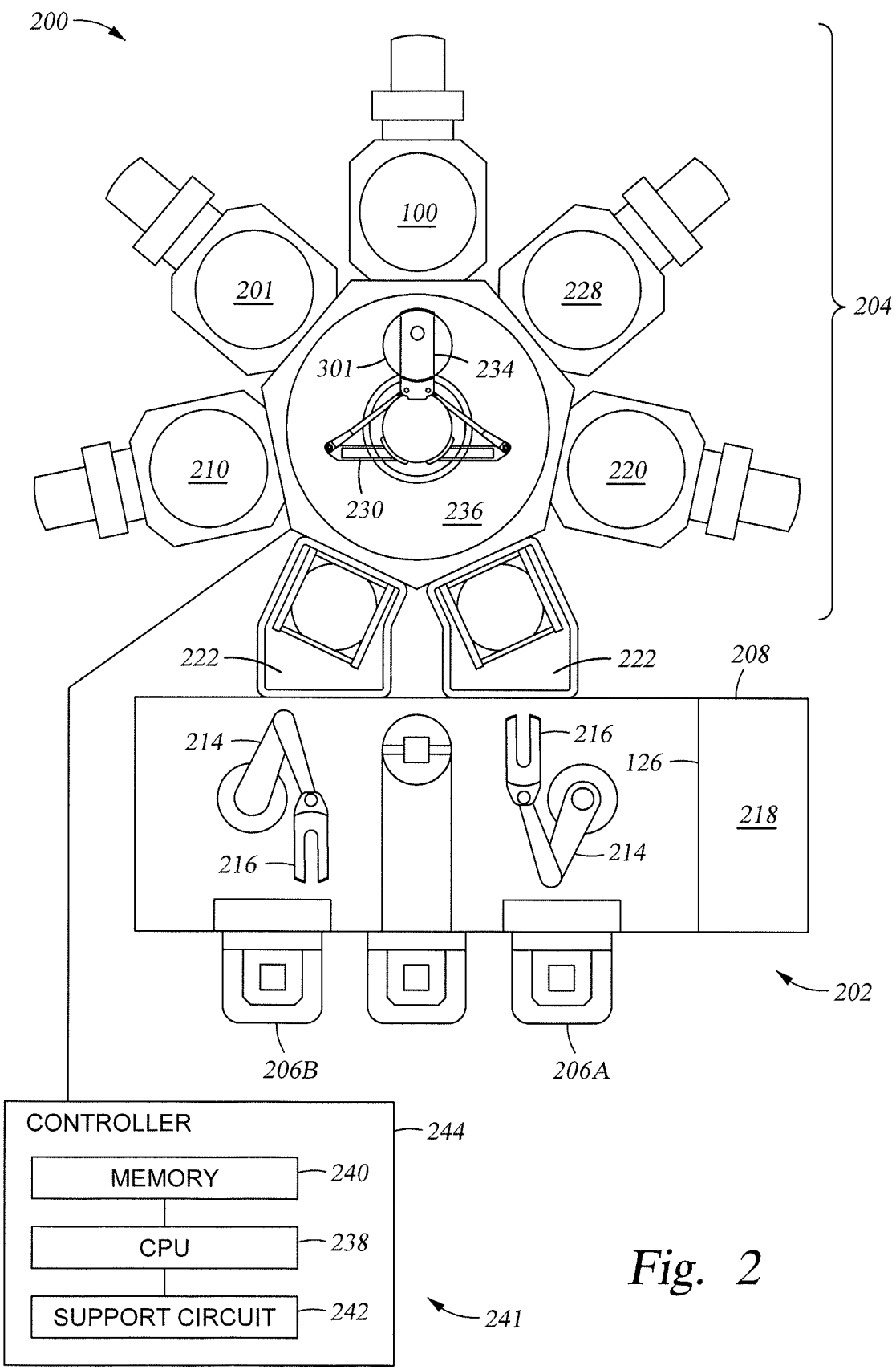
FIG. 2 depicts a top plan view of one embodiment of a processing tool including the apparatus of FIG. 1.

FIG. 2 is a schematic, top plan view of an exemplary processing system 200 that includes one or more of the processing chambers 100 illustrated in FIG. 1 that is incorporated and integrated therein. In one embodiment, the processing system 200 may be a CENTURA® integrated processing system, commercially available from Applied Materials, Inc., located in Santa Clara, Calif. It is contemplated that other processing systems (including those from other manufacturers) may be adapted to benefit from the disclosure.

The system 200 includes a vacuum-tight processing platform 204, a factory interface 202, and a system controller 244. The processing platform 204 includes at least one processing chamber 100, such as the one of the processing chambers 100 depicted from FIG. 1, a plurality of processing chambers 201, 228, 220, 210 and at least one load-lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, the factory interface 202 comprises at least one docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the robot 214 is configured to transfer the substrate from the factory interface 202 to the processing platform 204 for processing through the load lock chambers 222.

Optionally, one or more processing chambers 100, 201, 210, 220, 228 may be connected to a terminal 226 of the factory interface 202 to facilitate processing of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 301 among the load lock chambers 222, the deposition chamber 100, processing chamber 201, and the processing chambers 201, 210, 220, 228.

In one embodiment of the system 200, the system 200 may include a processing chamber 100 depicted in FIG. 1 (such as a high density plasma (HDP) chamber) and other processing chambers 201, 210, 220, 228, which may be a deposition chamber, etch chamber, thermal processing chamber or other similar type of semiconductor processing chamber that may assist forming a dielectric material with good gap filling capability to be filled in a trench in semiconductor devices.

The system controller 244 is coupled to the processing system 200. The system controller 244, which may include the computing device 241 or be included within the computing device 241, controls the operation of the processing system 200 using a direct control of the processing chambers 100, 201, 210, 220, 228 of the system 200. Alternatively, the system controller 244 may control the computers (or controllers) associated with the processing chambers 100, 201, 210, 220, 228 and the system 200. In operation, the system controller 244 also enables data collection and feedback from the respective chambers and the processing chambers 100 to optimize performance of the system 200.

The system controller 244, much like the controller 170 described above, generally includes a central processing unit (CPU) 238, a memory 240, and support circuits 242. The CPU 238 may be one of any form of a general purpose computer processor that can be used in an industrial setting. The support circuits 242 are conventionally coupled to the CPU 238 and may comprise cache, clock circuits, input/output subsystems, power supplies, and the like. The software routines transform the CPU 238 into a specific purpose computer (controller) 244. The software routines may also be stored and/or executed by a second controller (not shown) that is located remotely from the system 200.

Figure 3:
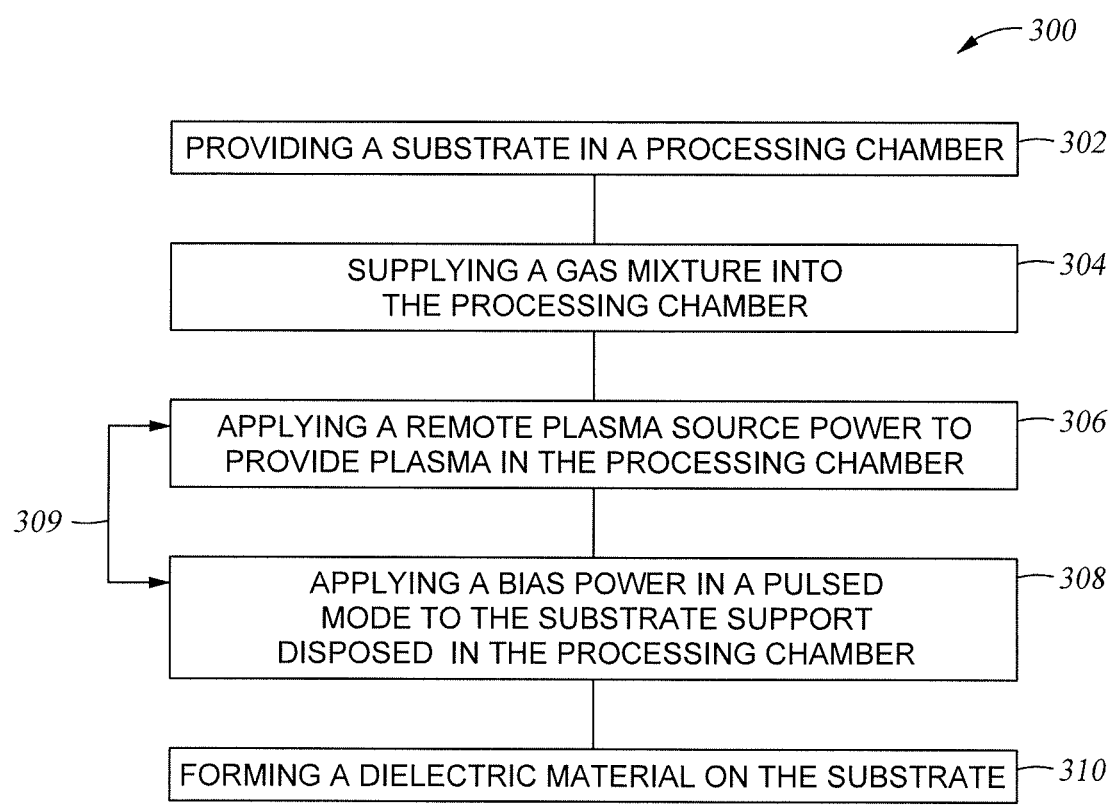
FIG. 3 is a process flow diagram illustrating a method for forming a dielectric material incorporating one embodiment of the disclosure.
Figure 4A:
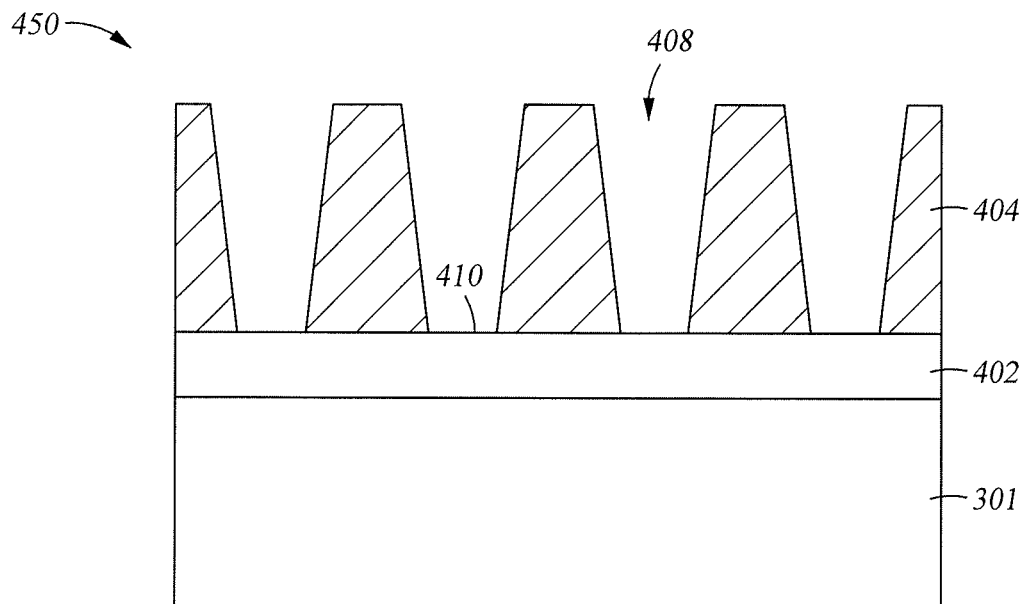
FIGS. 4A-4B depict one embodiment of a sequence for depositing a dielectric material in accordance with some embodiment of the present disclosure.
Figure 4B:
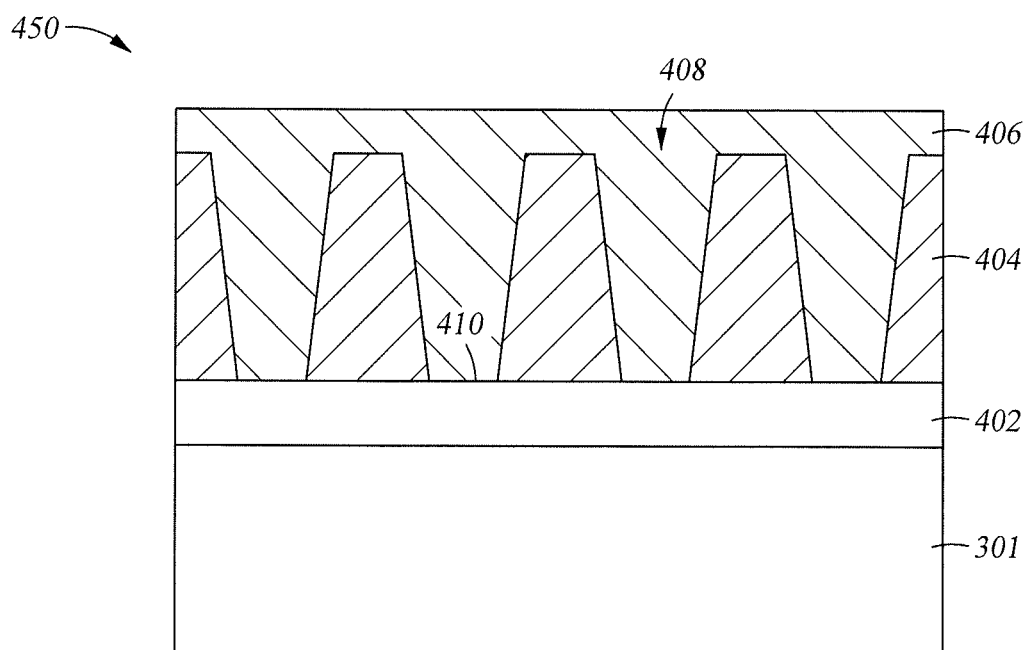

FIG. 3 is a flow diagram of one embodiment of a deposition process 300 that may be practiced in the chamber 100 or other suitable processing chamber. FIGS. 4A-4B are schematic cross-sectional views of a portion of a composite substrate corresponding to various stages of the deposition process 300. The process 300 may be utilized to form high aspect ratio features, e.g., greater than 5:1, for structures, for semiconductor devices, particularly for three dimensional (3D) stacking of semiconductor memory. Alternatively, the process 300 may be beneficially utilized to etch other types of structures.

The process 300 begins at operation 302 by transferring (i.e., providing) a substrate, such as the substrate 301, to a deposition process chamber, such as the deposition chamber 100 depicted in FIG. 1. The substrate 301 may have a substantially planar surface, an uneven surface, or a substantially planar surface having a structure formed thereon. In the embodiment depicted in FIG. 4A, the substrate 301 has a patterned material layer 404 disposed on an interface layer 402. In one embodiment, the patterned material layer 404 includes openings 408 formed therein. The patterned material layer 404 may be utilized to form a gate structure, a contact structure, an interconnection structure in the front end or back end processes, or any suitable structures as needed. In one embodiment, the process 300 may be performed on the patterned material layer 404 to form a contact structure therein. The substrate 301 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 301, the substrate 301 may include a buried dielectric layer disposed on a silicon crystalline substrate. In the embodiment depicted herein, the substrate 301 may be a crystalline silicon substrate.

In one embodiment, the interface layer 402 may be a dielectric layer. The patterned material layer 404 has the openings 408 that expose portions 410 of the interface layer 402 for depositing a dielectric material therein. The openings 408 described herein may include trenches, vias, openings and the like. In one embodiment, the patterned material layer 404 may be a metal containing material, silicon containing material, carbon containing materials, or other suitable materials. Suitable examples of the metal containing materials include copper containing material, aluminum containing materials, nickel containing material, tungsten containing material, or other metal containing materials. Suitable silicon containing materials include silicon, silicon oxide, silicon nitride, silicon oxynitride, and combinations thereof. Suitable carbon containing materials include silicon carbide, amorphous carbon or the like. In an exemplary embodiment depicted herein, the patterned material layer 404 is a silicon layer.

The interface layer 402 may be a dielectric layer, such as a dielectric oxide layer, or dielectric nitride layer as needed. The interface layer 402 may include multiple layers, composite layers, or a single layer. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG), silicon nitride, amorphous silicon, and combinations thereof.

In one embodiment, the patterned material layer 404 may be patterned to a predetermined depth to expose the portions 410 of the interface layer 402, as shown in FIG. 4A. The material layer 404 may be etched or patterned in any suitable patterning process. The patterned material layer 404 may be patterned by supplying a gas mixture into the processing chamber along with a predetermined RF power level applied to the processing chamber.

At operation 304, a deposition gas mixture is supplied to the processing chamber, such as the processing chamber 100 in FIG. 1, to perform the deposition process to form a dielectric material 406 (shown in FIG. 4B) in the openings 408. The gas mixture supplied to the processing chamber 100 may be varied based on different types of materials to be formed and filled in the openings 408. In one example, when the dielectric material 406 to be formed is desired to be a silicon nitride layer, the deposition gas mixture as supplied comprises at least one silicon containing gas, nitrogen containing gas, or optionally an inert gas. In another example, when the dielectric material 406 to be formed is desired to be a silicon oxide layer, the deposition gas mixture as supplied comprises at least one silicon containing gas, oxygen containing gas, or optionally an inert gas. In another example, when the dielectric material 406 to be formed is desired to be a silicon carbide layer, the deposition gas mixture as supplied comprises at least one silicon containing gas, carbon containing gas, or optionally an inert gas. In yet another example, when the dielectric material 406 to be formed is desired to be a carbide layer, the deposition gas mixture as supplied comprises at least one carbon containing gas, or optionally an inert gas.

Suitable examples of the silicon containing gas include $SiH_4$, TEOS, $Si_2H_6$, and the like. Suitable examples of the nitrogen containing gas include $N_2$, $NH_3$, $N_2O$, $NO_2$, and the like. Suitable examples of the oxygen containing gas include $H_2O_2$, $H_2O$, $O_2$, $O_3$, and the like. Suitable examples of the carbon containing gas include $CO_2$, hydrocarbon gases (such as $CH_4$ and $C_2H_6$), and the like. Suitable examples of the inert gas include He, Ar and the like.

In some examples, carrier gases, such as $N_2$, $H_2$ and the like may also be supplied as needed in the deposition gas mixture.

In one example, the deposition gas mixture includes silicon containing gas, nitrogen or carbon containing gas, and Ar or $H_2$ gas. In one specific example, the deposition gas mixture includes $SiH_4$, Ar or He, $NH_3$, $H_2$ or $N_2$, or combinations thereof for depositing a silicon nitride layer as the dielectric material 406. In another specific example, the deposition gas mixture includes $SiH_4$, Ar or He, $CH_4$ or $CO_2$, $H_2$ or $N_2$ for depositing a silicon carbide layer as the dielectric material 406. In yet another specific example, the deposition gas mixture includes $SiH_4$, Ar or He, $O_2$ or $NO_2$, for depositing a silicon oxide layer as the dielectric material 406.

In one embodiment, the silicon containing gas is controlled at a flow rate between about 30 sccm and about 500 sccm by volume. The oxygen, carbon, or nitrogen containing gas is controlled at a flow rate between about 50 sccm and about 2000 sccm by volume. The Ar or He gas is controlled at a flow rate between about 250 sccm and about 2000 sccm by volume.

In one embodiment, some of the gases from the deposition gas mixture may be supplied from the gas source 106 through the remote plasma source 104 to the interior processing region 151 while some of the gases may be supplied through a side of the processing chamber 100, such as the fluid sources 119 that laterally formed around the showerhead 118, to be delivered to the interior processing region 151. In some examples, a first gas (e.g., the reactive precursors) from the deposition gas mixture, such as silicon containing gases, are supplied from side (e.g., the fluid sources 119) of the processing chamber 100 while a second gas (e.g., the carrier gas, inert gas, carbon or nitrogen containing gases or other gases) from the deposition gas mixture are supplied from the gas source 106 through the remote plasma source 104 to the interior processing region 151. In one example, the first gas is $SiH_4$ gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151.

At operation 306, after the deposition gas mixture is supplied to the processing chamber, a remote plasma source power is applied to the remote plasma source 104 to generate a remote plasma to be delivered from the remote plasma source 104 to the interior processing region 151. It is believed that remotely dissociated gas and/or other gases can provide high density and low energy atomic species, as compared to conventional in-chamber RF source power applied to the showerhead, which may provide high energy but relatively low density gas radicals. Thus, by utilizing the remote plasma source with certain active gas species along with the gases supplied from the side, e.g., from the fluid sources 119, the high density gas species with relatively low energy atomic species, are then delivered to the interior processing region 151 to form the dielectric material 406 on the substrate 301, as shown in FIG. 4B. It is believed that atomic gas species from the remote plasma source has higher degree of reactivity, which may react with reacting gas precursors supplied from the side, e.g., from the fluid sources 119, more efficiently, slowly and thoroughly, thus providing a good gap filling capability to fill the dielectric material 406 into the openings 408 defined in the patterned material layer 404.

It is noted that the amount of each gas introduced into the processing chamber may be varied and adjusted to accommodate, for example, the thickness of the dielectric material 406 (e.g., the height or geometry of the openings 408) to be formed in the openings 408. In one or more embodiments, the gases supplied from the remote plasma source 104 may have certain ratios. For example, a ratio of the nitrogen or carbon containing gas to the Ar gas may be controlled between about 0.2:1 and about 2:1 by volume.

In one example, a remote RF source power of between about 1000 Watts and about 10000 Watts, such as between about 2000 Watts and about 4000 Watts, is supplied to the remote plasma source 104 to generate remote plasma to be delivered to the interior processing region 151. The frequency at which the power to the remote plasma source 104 is applied around 400 kHz. The frequency can range from about 50 kHz to about 2.45 GHz. A substrate temperature is maintained between about −20 degrees Celsius to about 200 degrees Celsius, such as between about 20 degrees Celsius and about 90 degrees Celsius.

At operation 308, while supplying the remote plasma from the remote plasma source 104 to the interior processing region 151, a pulsed RF bias power may be applied to the substrate support member 152 to generate a RF bias power to the substrate 301 disposed on the substrate support member 152. It is noted that the RF bias power generated to the substrate support member 152 is utilized to assist providing directionality to the plasma in the interior processing region 151 during the deposition process. In one embodiment, the RF bias power may be provided at 60 MHz and/or 2 MHz as needed. In one particular embodiment, the RF bias power is provided at 60 MHz, at 2 MHz or at 400 KHz.

In some examples, the RF bias power may be supplied to the substrate support member 152 in pulsed mode. It is believed that the RF bias power supplied in a pulse mode can provide a relatively mild RF power level to the substrate 301 disposed on the substrate support assembly so that the reactive species can be accelerated toward the substrate 301 with a relatively mild energy level. The RF bias power supplied to the substrate support member 152 may be simultaneously, concurrently, separately, alternatively, or sequentially with the remote plasma power supplied from the remote plasma source 104.

Figure 5A:
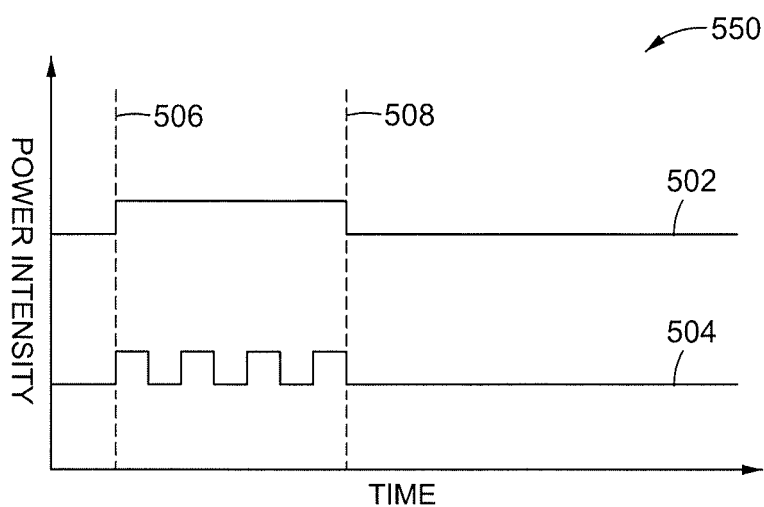
FIGS. 5A-5C depict different embodiments of a remote plasma source power and the RF bias power control utilized during the deposition process of FIG. 3 in accordance with some embodiment of the present disclosure.
Figure 5B:
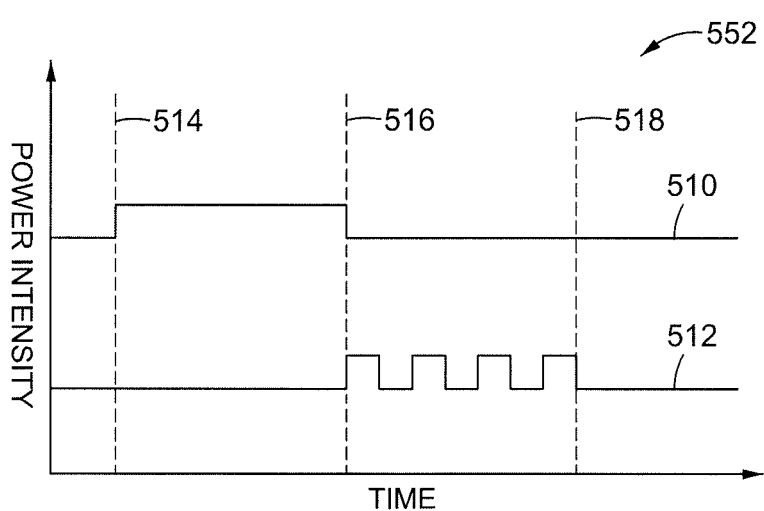
Figure 5C:
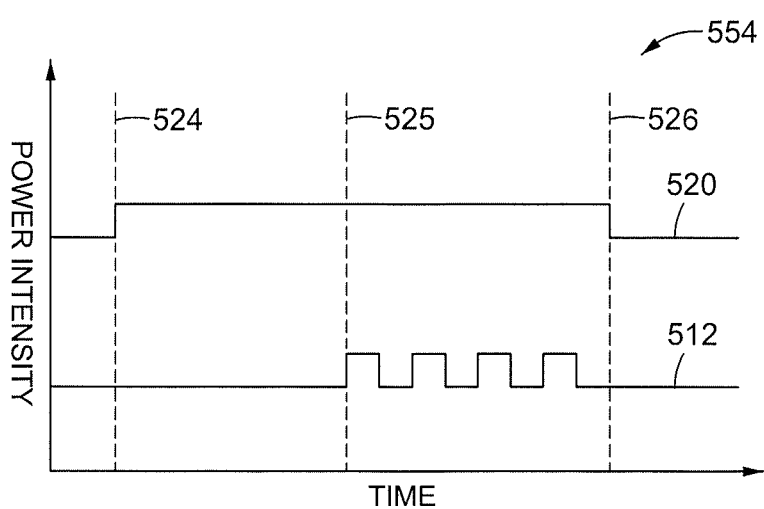

FIGS. 5A-5C depict different examples of the RF bias power supplied to the substrate support member 152 during the deposition process. FIG. 5A-5C depicts a power intensity supplied to the processing chamber 100 plotted as a function of time. The trace lines 502, 510, 520 depicted in FIGS. 5A-5C shows the power intensity supplied from the remote plasma source 104 while the trace lines 504, 512, 522 shows the power intensity supplied from the RF bias power source 145 to the substrate support member 152.

In the graph 550 depicted in FIG. 5A, the remote plasma is supplied from the remote plasma source 104 concurrently with the RF bias power supplied to the substrate support member 152 to the substrate 301 for a predetermined time period from a first time point 506 to a second time point 508. While the remote plasma from the remote plasma source 104 is supplied in a continuous mode, the RF bias power supplied to the substrate support member 152 is in pulsed mode. The remote plasma from the remote plasma source 104 and the RF bias power supplied to the substrate support member 152 may be terminated (i.e., turned off) concurrently at the second time point 508 when a desired thickness of the dielectric material 406 is filled in the openings 408 in the material layer 404. In this example, the dielectric material 406 formed in the material layer 404 may be a silicon nitride material.

In the graph 552 depicted in FIG. 5B, the remote plasma is supplied from the remote plasma source 104 from a first time point 514 to a second time point 516. Subsequently, after the power applied to the remote plasma source 104 is terminated (e.g., the remote plasma supplied from the remote plasma source 104 is turned off) at the second time point 516, the RF bias power is then supplied to the substrate support member 152 in pulsed mode from the second time point 516 to a third time point 518. The RF bias power supplied to the substrate support member 152 in pulsed mode may be terminated (i.e., turned off) when a desired thickness of the dielectric material 406 is filled in the openings 408 in the material layer 404. In this example, the dielectric material 406 formed in the material layer 404 may be a silicon nitride material.

In the graph 554 depicted in FIG. 5C, the remote plasma is supplied from the remote plasma source 104 from a first time point 524 to a second time point 525. While the remote plasma from the remote plasma source 104 is still continuously supplied, the RF bias power is then supplied to the substrate support member 152 in pulsed mode from the second time point 525 to a third time point 526. Thus, the remote plasma from the remote plasma source 104 is partly simultaneously supplied with the RF bias power to the substrate support member 152. The remote plasma from the remote plasma source 104 and the RF bias power supplied to the substrate support member 152 in pulsed mode may be concurrently terminated (i.e., turned off) at the third time point 526 when a desired thickness of the dielectric material 406 is filled in the openings 408 in the material layer 404.

It is noted that the supply of the remote plasma from the remote plasma source 104 and the RF bias power to the substrate support member 152 may be in any arrangement, any order and any sequence as needed.

It is believed that the RF bias power supplied to the substrate support member 152 may assist accelerating the electrons, ions, and other species in the plasma toward the deep end (e.g., the exposed portions 410 of the interface layer 402) of the openings 408. The acceleration generated from the RF bias power may help enhancing the gap filling capability while filling the dielectric material 406 into the openings 408. Furthermore, by controlling the pulse time periods and pulsed power intensities from the RF bias power, overly energetic or aggressive reactive species may be eliminated so as to control the deposition profile, reactive species trajectory and deposition directionality as needed.

In one example, the RF bias power may be provided at 60 MHz and/or 2 MHz as needed. In one particular embodiment, the RF bias power is provided at about 162 MHz, 60 MHz or 2 MHz. In one example, a RF bias power having a 2 MHz frequency is supplied at between about 1000 Watts and about 4000 Watts, such as between about 1500 Watts and about 3000 Watts to the substrate support member 152. The RF bias power may be utilized at duration between about 210 micro-seconds and about 100 mini-seconds. A substrate temperature is maintained between about −20 degrees Celsius to about 200 degrees Celsius, such as between about 20 degrees Celsius and about 90 degrees Celsius.

It is noted that the operation 306 and operation 308 may be repeatedly (i.e., cyclically) performed, as indicated by the loop 309 in FIG. 3, until the openings 408 in the patterned material layer 404 is filled with the dielectric material 406, as shown in FIG. 4B. The repeated processes may cyclically and incrementally deposit the dielectric material 406 with good gap filling capability. Overly aggressive reactive species may react with a relatively higher deposition rate, eventually leading to early closure of the openings 408, forming undesired voids or air gaps in the openings 408 while filling the openings 408 with the dielectric material 406. Incremental deposition improves gap filling capability and enhances deposition profile of the dielectric material 406 formed in the openings 408 in the material layer 404.

At operation 310, after the desired thickness of the dielectric material 406 is filled in the openings 408, the dielectric material 406 is then formed on the substrate 301. Thus, the process 300 is then completed and the substrate 301 may be removed from the processing chamber.

By utilizing the deposition process with good gap filling capability, additionally treatment process or curing process may be eliminated so as to improve manufacturing cycle time and cost.

Thus, methods for depositing a dielectric material in a opening with high aspect ratio and small dimension are provided by proper management of remote plasma power and RF bias power during the deposition process. By alternatively, simultaneously, or partly simultaneously remote plasma power and RF bias power with different supplying mode (e.g., continuous mode or pulsed mode) during the deposition process, a deposition process with good gap filling capability is obtained. By doing so, an improved deposition process to fill the dielectric material in the openings with high aspect ratio and small dimension, particularly for applications in three dimensional (3D) stacking of semiconductor chip, is obtained.

While the foregoing is directed to embodiments of the present invention, other and further embodiments of the invention may be devised without departing from the basic scope thereof, and the scope thereof is determined by the claims that follow.

The invention claimed is:

1. A method of depositing a dielectric material comprising:
providing a first gas to form a gas mixture delivered to an interior processing region of the processing chamber having a substrate disposed therein;
forming a remote plasma in a remote plasma source connected to a lid of the processing chamber and delivering the remote plasma to the interior processing region defined in the processing chamber;
applying an RF bias power to a substrate support member disposed in the processing chamber in pulsed mode, wherein the remote plasma is formed prior to applying the RF bias power to the processing chamber; and
depositing the dielectric material, while applying the RF bias power, in an opening defined in a material layer disposed on an interface layer of the substrate in the presence of the gas mixture and the remote plasma.

2. The method of claim 1, wherein the interface layer is a dielectric material comprising at least one of undoped silicon glass, silicon oxide, TEOS, boron-silicate glass, phosphorus-silicate glass, boron-phosphorus-silicate glass, silicon nitride, or amorphous silicon.

3. The method of claim 1, wherein the dielectric material covers the interface layer and an opening in the dielectric layer exposes a portion of the interface layer.

4. The method of claim 1, wherein forming the remote plasma further comprises:
forming the remote plasma for a predetermined period of time; and
terminating the remote plasma prior to applying the RF bias power.

5. The method of claim 1, wherein the first gas is supplied through a side of the processing chamber laterally formed around a showerhead to the interior processing region.

6. The method of claim 5, wherein the first gas comprises a silicon containing gas.

7. The method of claim 1, wherein the gas mixture comprises a second gas supplied through the remote plasma source to the interior processing region.

8. The method of claim 7, wherein the remote plasma is formed in the remote plasma source in the presence of the second gas from the gas mixture.

9. The method of claim 8, wherein the second gas is selected from the group consisting of nitrogen containing gas, inert gas, carbon containing gas and oxygen containing gas.

10. The method of claim 7, wherein the second gas comprises at least one of Ar, He, $NH_3$, $H_2$, $N_2$, and combinations thereof.

11. The method of claim 1, wherein the dielectric material formed on the substrate is a silicon nitride layer.

12. The method of claim 1, wherein the dielectric material formed on the substrate is a silicon carbide layer.

13. The method of claim 1, wherein a temperature of the substrate is maintained between about −20 degrees Celsius to about 200 degrees Celsius.

14. The method of claim 1, wherein the RF bias power is applied in the pulsed mode at a duration between about 210 micro-seconds and about 100 milliseconds.

15. The method of claim 1, wherein the RF bias power has a RF frequency of about 2 MHz.

16. A method for forming a dielectric material comprising:
forming a remote plasma from a remote plasma source and delivering the remote plasma to an interior processing region of a processing chamber,
applying a RF bias power to a substrate support member disposed in the processing chamber, wherein the remote plasma is formed prior to applying the RF bias power to the processing chamber;
maintaining a temperature of a substrate between about −20 degrees Celsius to about 200 degrees Celsius; and
depositing the dielectric material, while applying the RF bias power, in an opening defined in a material layer disposed on an interface layer of the substrate, wherein the dielectric material is either a silicon nitride material or a silicon carbide material.

17. The method of claim 16, wherein the opening has an aspect ratio greater than 5.

18. The method of claim 16, wherein the remote plasma is formed from the remote plasma source without an RF source power applied to the processing chamber.

19. The method of claim 16, wherein the RF bias power is applied to the substrate support member concurrently or after the remote plasma is formed and delivered to the interior processing region of the processing chamber.

20. A method for forming a dielectric material comprising:
depositing within an opening defined in a material layer disposed on an interface layer of the substrate dielectric material formed from a remote plasma, the opening having an aspect ratio greater than 5 on the substrate, wherein while depositing the dielectric material RF bias power in pulsed mode is supplied to an interior processing region of a processing chamber where the substrate is disposed, wherein the remote plasma is formed prior to applying the RF bias power to the processing chamber.

* * * * *